US010418782B2

(12) United States Patent
Zheng et al.

(10) Patent No.: US 10,418,782 B2
(45) Date of Patent: Sep. 17, 2019

(54) WAVELENGTH-SELECTABLE LASER DEVICE PROVIDING SPATIALLY-SELECTABLE WAVELENTH(S)

(71) Applicant: Applied Optoelectronics, Inc., Sugar Land, TX (US)

(72) Inventors: Jun Zheng, Missouri City, TX (US); Stefan J. Murry, Houston, TX (US); Bujin Guo, Houston, TX (US)

(73) Assignee: Applied Optoelectronics, Inc., Sugar Land, TX (US)

( * ) Notice: Subject to any disclaimer, the term of this patent is extended or adjusted under 35 U.S.C. 154(b) by 70 days.

(21) Appl. No.: 15/640,978

(22) Filed: Jul. 3, 2017

(65) Prior Publication Data

US 2017/0310085 A1    Oct. 26, 2017

Related U.S. Application Data

(62) Division of application No. 13/357,116, filed on Jan. 24, 2012, now Pat. No. 9,698,567.

(Continued)

(51) Int. Cl.
*H04J 14/02* (2006.01)
*H01S 5/14* (2006.01)
(Continued)

(52) U.S. Cl.
CPC .......... *H01S 5/143* (2013.01); *H04B 10/506* (2013.01); *H04J 14/02* (2013.01); *H01S 3/08063* (2013.01);
(Continued)

(58) Field of Classification Search
CPC ...... H01S 5/101; H01S 5/141; H01S 2301/02; H01S 2301/16; H01S 3/08059;
(Continued)

(56) References Cited

U.S. PATENT DOCUMENTS

2003/0053750 A1* 3/2003 Yang .................. G02B 6/266
385/27
2004/0004979 A1* 1/2004 Lin .................... H01S 5/1032
372/20

(Continued)

OTHER PUBLICATIONS

Palmer, Christopher, "Diffraction Gratings—The Crucial Dispersive Component", The Baseline, reprinted from Spectroscopy, vol. 10, No. 2, Feb. 1995, pp. 14-15.

*Primary Examiner* — Tanya T Motsinger
(74) *Attorney, Agent, or Firm* — Grossman Tucker Perreault & Pfleger, PLLC; Norman S. Kinsella

(57) ABSTRACT

A wavelength-selectable laser device providing spatially-selectable wavelength(s) may be used to select one or more wavelengths for lasing in a tunable transmitter or transceiver, for example, in a wavelength division multiplexed (WDM) optical system such as a WDM passive optical network (PON). The wavelength-selectable laser device uses a dispersive optical element, such as a diffraction grating, to disperse light emitted from a laser emitter and to direct different wavelengths of the light toward a reflector at different spatial positions such that the wavelengths may be selected by allowing light to be reflected from selected spatial position(s) back into the laser emitter. Thus, the reflected light with a wavelength at the selected spatial position(s) is allowed to complete the laser cavity.

6 Claims, 5 Drawing Sheets

Related U.S. Application Data

(60) Provisional application No. 61/508,023, filed on Jul. 14, 2011, provisional application No. 61/508,030, filed on Jul. 14, 2011, provisional application No. 61/508,008, filed on Jul. 14, 2011.

(51) Int. Cl.
*H04B 10/50* (2013.01)
*H01S 3/08* (2006.01)
*H01S 3/105* (2006.01)
*H01S 3/106* (2006.01)
*H01S 5/022* (2006.01)

(52) U.S. Cl.
CPC .............. *H01S 3/105* (2013.01); *H01S 3/106* (2013.01); *H01S 5/02248* (2013.01); *H01S 5/02284* (2013.01); *H04J 14/025* (2013.01); *H04J 14/0246* (2013.01); *H04J 14/0282* (2013.01)

(58) Field of Classification Search
CPC ........ H01S 3/109; H01S 5/005; H01S 5/0287; H01S 5/1032; H01S 5/1092; H01S 5/14
See application file for complete search history.

(56) References Cited

U.S. PATENT DOCUMENTS

| | | |
|---|---|---|
| 2005/0135449 A1 | 6/2005 | Sorin et al. |
| 2007/0133628 A1* | 6/2007 | Komatsu ................ H01S 5/183 372/21 |
| 2009/0185586 A1 | 7/2009 | Jhung et al. |
| 2009/0238217 A1* | 9/2009 | Moser .................... H01S 5/141 372/20 |
| 2011/0292953 A1* | 12/2011 | Liu ..................... H01S 5/06256 372/20 |
| 2012/0127472 A1* | 5/2012 | Alphonse ............ A61B 5/0066 356/456 |
| 2013/0016972 A1* | 1/2013 | Zheng .................... H04J 14/02 398/71 |
| 2013/0016973 A1* | 1/2013 | Zheng ................ H04B 10/506 398/72 |
| 2017/0025819 A1* | 1/2017 | Fu .......................... H01S 3/105 |

* cited by examiner

WAVELENGTH-SELECTABLE LASER DEVICE PROVIDING SPATIALLY-SELECTABLE WAVELENTH(S)

CROSS-REFERENCE TO RELATED APPLICATIONS

This application is a divisional of U.S. patent application Ser. No. 13/357,116 filed Jan. 24, 2012, which claims the benefit of U.S. Provisional Patent Application Ser. No. 61/508,023 filed on Jul. 14, 2011, U.S. Provisional Patent Application Ser. No. 61/508,030 filed on Jul. 14, 2011, and U.S. Provisional Patent Application Ser. No. 61/508,008 filed on Jul. 14, 2011, all of which are fully incorporated herein by reference.

TECHNICAL FIELD

The present invention relates to lasers and more particularly, to a wavelength-selectable laser device providing a spatially-selectable wavelength for use in tunable transmitters or transceivers in a wavelength division multiplexed (WDM) passive optical network (PON).

BACKGROUND INFORMATION

Optical communications networks have been deployed for many years. Originally, these networks were generally "point to point" type networks including a transmitter and a receiver connected by an optical fiber. Such networks are relatively easy to construct but deploy many fibers to connect multiple users. As the number of subscribers connected to the network increases, the fiber count also increases rapidly and the expense of deploying and managing many fibers becomes complex and expensive.

A passive optical network (PON) addresses this problem by using a single "trunk" fiber from a transmitting end of the network, such as an optical line terminal (OLT), to a remote branching point, which may be up to 20 km or more. Each subscriber may thus be connected to the network utilizing a much shorter fiber span forming an architecture sometimes referred to as "tree and branch." One challenge in developing such a PON is utilizing the capacity in the trunk fiber efficiently in order to transmit the maximum possible amount of information on the trunk fiber.

To improve efficiency, PONs have used "time domain multiplexing" by assigning each subscriber on the PON a particular time slot for transmission of its data along the trunk fiber. Each subscriber is allowed to transmit during its assigned time slot, and these slots are synchronized at both the transmitter and receiver such that the receiver knows the time slot (and thus the transmitter) of a transmitted signal. In this way, many transmitters can share the same fiber without fear of multiple transmitters sending data at the same time and confusing the receiver. Standards such as gigabit PON (G-PON) and Ethernet-based PON (E-PON), for example, utilize this time-dependant approach.

Although TDM-PON systems work, the TDM approach is inefficient because the system should allow sufficient time between different transmitter time slots to prevent confusion at the receiving end. Also, noise in this type of system is cumulative across all the transmitters in the PON. To avoid unwanted noise, transmitters other than the one currently transmitting may be turned off and then turned on rapidly when it is time to transmit data, without providing much stabilization time. This "burst mode" transmission makes it challenging to increase data rates in a TDM-PON system.

TDM also does not make efficient use of the bandwidth available on the fiber. Optical fiber has the ability to carry many different signals simultaneously, without interfering, as long as these different signals are carried on different wavelengths. TDM-PON systems utilize only a few wavelengths and therefore do not utilize much of the fundamental bandwidth available on the optical fiber. Similar to radio transmissions utilizing different frequencies to carry different signals, fiber optic communications networks may increase the amount of information carried on a single optical fiber by multiplexing different optical signals on different wavelengths using wavelength division multiplexing (WDM).

In a WDM-PON, a single trunk fiber carries data to and from an optical branching point and the branching point provides a simple routing function by directing signals of different wavelengths to and from individual subscribers. In this case, each subscriber is assigned a particular wavelength on which to send and/or receive data. The WDM-PON thus allows much greater bandwidth because each transmitter is allowed to transmit at a higher data rate and for a longer period of time.

A challenge in a WDM-PON, however, is designing a network that will allow the same transmitter to be used in an optical networking terminal (ONT) at any subscriber location. For ease of deployment and maintenance in a WDM-PON, it is desirable to have a "colorless" ONT whose wavelength can be changed or tuned such that a single device could be used in any ONT on the PON. With a "colorless" ONT, an operator only needs to have a single, universal transmitter or transceiver device that can be employed at any subscriber location.

One or more tunable laser sources may be used to provide multiple optical signals at different wavelengths in a WDM system or network such as a WDM-PON. Similar to a tuner section of a radio transmitter allowing the transmitter to select the frequency on which to transmit, a tunable laser has the capability to select different wavelengths on which to transmit optical signals. Various different types of tunable lasers have been developed over the years, but most of these were developed for high-capacity backbone connections to achieve high performance and at a relatively high cost. Many tunable laser sources rely on continuous tuning mechanisms and may be difficult and expensive to construct because of extremely tight manufacturing tolerances. Many continuously tunable lasers also require an external means to "lock" the wavelength similar to a phase-locked loop or crystal reference oscillator in a radio tuner. These wavelength lockers are used because the continuously tunable designs are often highly sensitive to external conditions that can cause the wavelength to drift if not corrected. Conditions such as temperature or external electrical or magnetic fields, for example, can cause drift in some continuously-tunable laser designs.

Many WDM-PON applications have lower data rates and shorter transmission distances as compared to high-capacity, long-haul WDM systems, and thus a lower performance and lower cost laser may suffice. Also, continuous tuning may not be necessary in WDM-PON applications, although the ability to select a wavelength from among several wavelengths (e.g., in a grid of channel wavelengths) is desirable. In some of these applications, the wavelength may be selected only once in the lifetime of the laser (i.e., when it is initially installed) and this wavelength may not need to be changed again.

BRIEF DESCRIPTION OF THE DRAWINGS

These and other features and advantages will be better understood by reading the following detailed description, taken together with the drawings wherein.

DETAILED DESCRIPTION

A wavelength-selectable laser device providing spatially-selectable wavelength(s), consistent with embodiments described herein, may be used to select one or more wavelengths for lasing. The wavelength-selectable laser device uses a dispersive optical element, such as a diffraction grating, to disperse light emitted from a laser emitter and to direct different wavelengths of the light toward a reflector at different spatial positions such that the wavelengths may be selected by allowing light to be reflected from selected spatial position(s) back into the laser emitter. Thus, the reflected light with a wavelength at the selected spatial position(s) is allowed to complete the laser cavity.

The wavelengths may be spatially selected, for example, by varying the reflectivity of a surface of the reflector, by using a spatial filter between the dispersive optical element and the reflector, or by using a mirror array with selectable reflective elements, as will be described in greater detail below. Spatial selection of the wavelength(s) separated by the dispersive optical element allows wavelength selection without moving the dispersive optical element. Such a wavelength-selectable laser device may be used in a tunable transmitter or transceiver, for example, in a wavelength division multiplexed (WDM) optical system such as a WDM passive optical network (PON) to select channel wavelengths.

As used herein, "channel wavelengths" refer to the wavelengths associated with optical channels and may include a specified wavelength band around a center wavelength. In one example, the channel wavelengths may be defined by an International Telecommunication (ITU) standard such as the ITU-T dense wavelength division multiplexing (DWDM) grid. The term "coupled" as used herein refers to any connection, coupling, link or the like by which signals carried by one system element are imparted to the "coupled" element. Such "coupled" devices are not necessarily directly connected to one another and may be separated by intermediate components or devices that may manipulate or modify such signals.

Figure 1:
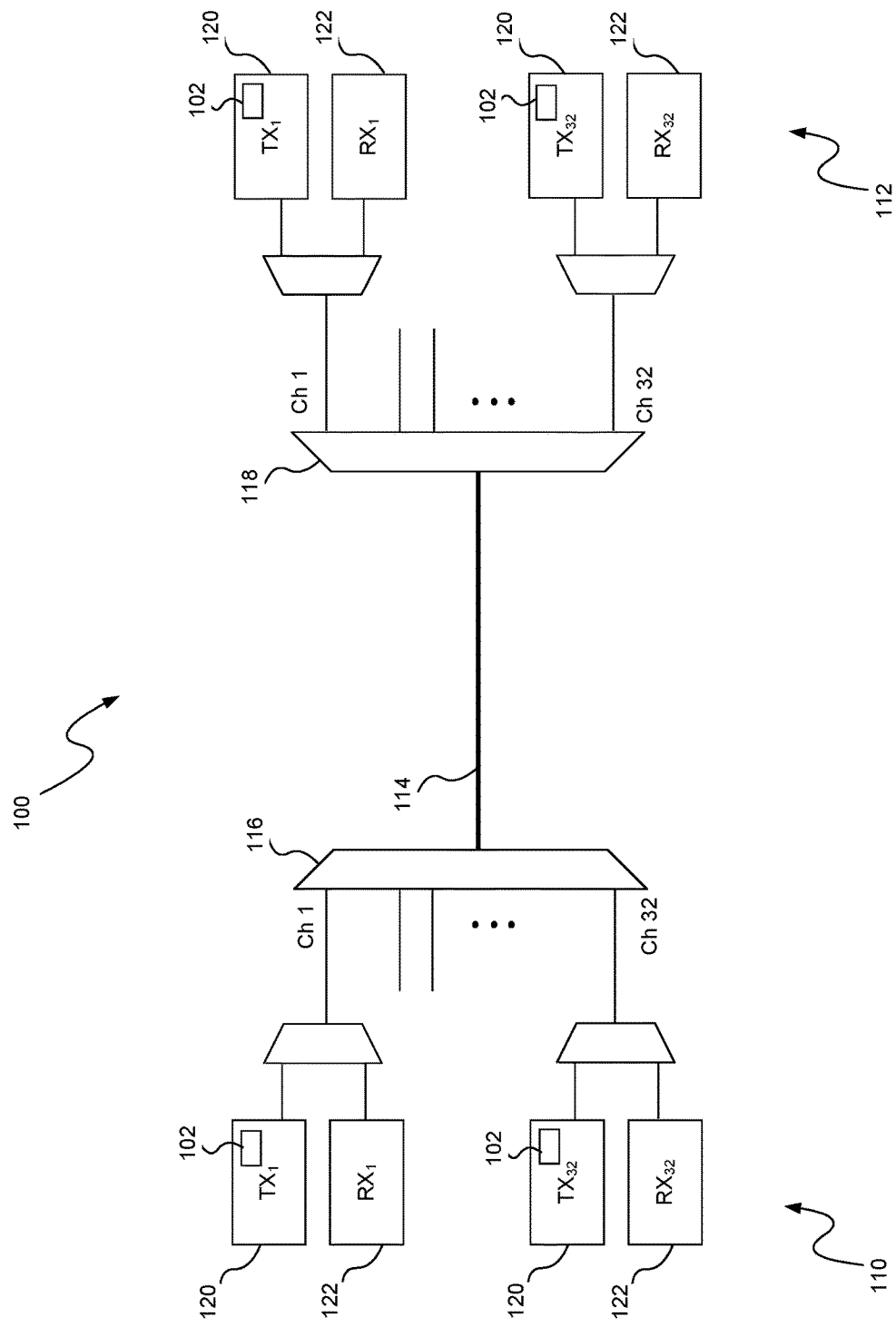
FIG. 1 is a diagrammatic view of a wavelength division multiplexed (WDM) optical communication system including a wavelength-selectable laser device providing spatially-selectable wavelength(s), consistent with an embodiment.

Referring to FIG. 1, one embodiment of a WDM system 100 including one or more wavelength-selectable laser devices 102, consistent with embodiments of the present disclosure, is shown and described. The WDM system 100 may include one or more terminals 110, 112 coupled at each end of a trunk optical fiber or path 114 for transmitting and receiving optical signals at different channel wavelengths over the trunk optical path 114. The terminals 110, 112 at each end of the WDM system 100 include transmitters 120 (e.g., $TX_1$ to $TX_{32}$) and receivers 122 (e.g., $RX_1$ to $RX_{32}$) associated with different channels (e.g., Ch. 1 to Ch. 32) for transmitting and receiving optical signals at the different channel wavelengths between the one or more terminals 110, 112. Although thirty-two (32) channels are shown in the illustrated embodiment, other numbers of channels are possible in a WDM system.

The WDM system 100 may also include optical multiplexers/demultiplexers 116, 118 for combining and separating the optical signals at the different channel wavelengths. Aggregate WDM optical signals including the combined channel wavelengths are carried on the trunk optical fiber or path 114. Each terminal 110, 112 may include one or more transmitters 120 and receivers 122, and the transmitters 120 and receivers 122 may be separate or integrated as a transceiver within a terminal. One or more of the transmitters 120 are tunable transmitters capable of being tuned to the appropriate channel wavelength using the wavelength-selectable laser device(s) 102. Thus, the transmitters 120 may be constructed as universal, tunable transmitters capable of being used in different locations in the WDM system 100 and tuned to the appropriate channel wavelength depending upon the location in the WDM system 100.

Figure 2:
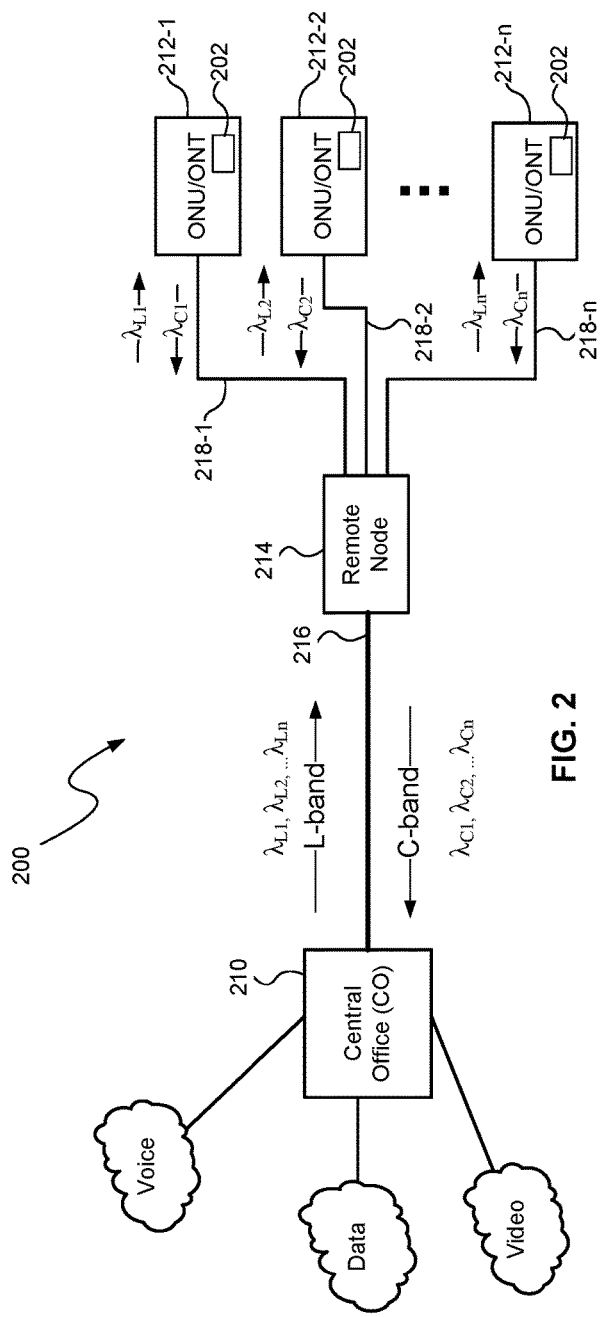
FIG. 2 is a diagrammatic view of a WDM passive optical network (PON) including a wavelength-selectable laser device providing spatially-selectable wavelength(s), consistent with an embodiment.

Referring to FIG. 2, one or more wavelength-selectable laser devices 202, consistent with embodiments of the present invention, may be used in transmitters and/or transceivers in a WDM-PON 200. The WDM-PON 200 provides a point-to-multipoint optical network architecture using a WDM system. According to one embodiment of the WDM-PON 200, a central office (CO) 210 including one or more optical line terminals (OLTs) may be coupled to a plurality of optical networking terminals (ONTs) or optical networking units (ONUs) 212-1 to 212-$n$ via optical fibers, waveguides, and/or paths 216, 218-1 to 218-$n$. A branching point 214 couples the trunk optical path 216 to the separate optical paths 218-1 to 218-$n$ to the ONUs/ONTs 212-1 to 212-$n$ at the subscriber locations. The branching point 214 may include one or more passive coupling devices such as a splitter or optical multiplexer/demultiplexer. The ONUs/

ONTs 212-1 to 212-n may be located in homes, businesses or other types of subscriber location or premises.

The WDM-PON 200 may also include additional nodes or network devices, such as Ethernet PON (EPON) or Gigabit PON (GPON) nodes or devices, coupled between the branching point 214 and ONUs/ONTs 212-1 to 212-n at different locations or premises. One application of the WDM-PON 200 is to provide fiber-to-the-home (FTTH) or fiber-to-the-premises (FTTP) capable of delivering voice, data, and/or video services across a common platform. In this application, the CO 210 may be coupled to one or more sources or networks providing the voice, data and/or video.

In the WDM-PON 200, different ONUs/ONTs 212-1 to 212-n may be assigned different channel wavelengths and optical signals may be transmitted on the different channel wavelengths and combined and separated using WDM techniques. In one embodiment, the WDM-PON 200 may use different wavelength bands for transmission of downstream and upstream optical signals relative to the CO 210. For example, the L-band (e.g., about 1565 to 1625 nm) may be used for downstream transmissions and the C-band (e.g., about 1530 to 1565 nm) may be used for upstream transmissions. Other wavelengths and wavelength bands are also within the scope of the system and method described herein.

The ONUs/ONTs 212-1 to 212-n may thus be assigned different channel wavelengths within the L-band and within the C-band. Transceivers or receivers located within the ONUs/ONTs 212-1 to 212-n may be configured to receive an optical signal on at least one channel wavelength in the L-band. The branching point 214 may split the downstream aggregate WDM optical signal (e.g., $\lambda_{L1}, \lambda_{L2}, \ldots \lambda_{Ln}$) from the CO 210 for transmission to the respective ONUs/ONTs 212-1 to 212-n. The branching point 214 may demultiplex the WDM optical signal and provide the separate channel wavelengths to the respective ONUs/ONTs 212-1 to 212-n. Alternatively, the branching point 214 may provide the WDM optical signal to each of the ONUs/ONTs 212-1 to 212-n and each of the ONUs/ONTs 212-1 to 212-n separates and processes the assigned optical channel wavelength. The individual optical signals may be encrypted to prevent eavesdropping on optical channels not assigned to a particular ONU/ONT.

Transceivers or transmitters located within the ONUs/ONTs 212-1 to 212-n may be configured to transmit an optical signal on at least one channel wavelength in the C-band, for example, by selecting the channel wavelength with the respective wavelength-selectable laser device 202. The branching point 214 combines the upstream optical signals (e.g., $\lambda_{C1}, \lambda_{C2}, \ldots \lambda_{Cn}$) from the respective ONUs/ONTs 212-1 to 212-n for transmission as an aggregate WDM optical signal over the trunk optical path 216. The channel wavelengths of the ONUs/ONTs 212-1 to 212-n may be set only once using the respective wavelength-selectable laser device 202 or may be changed as needed by selecting a different wavelength, although continuous tuning is generally not required in such systems.

Although two example WDM systems are illustrated, a wavelength-selectable laser device, consistent with embodiments described herein, may also be used in other types of optical systems. A wavelength-selectable laser device may be used, for example, to scan across a range of wavelengths in spectroscopy applications to analyze different absorption characteristics of a gas.

Figure 3:
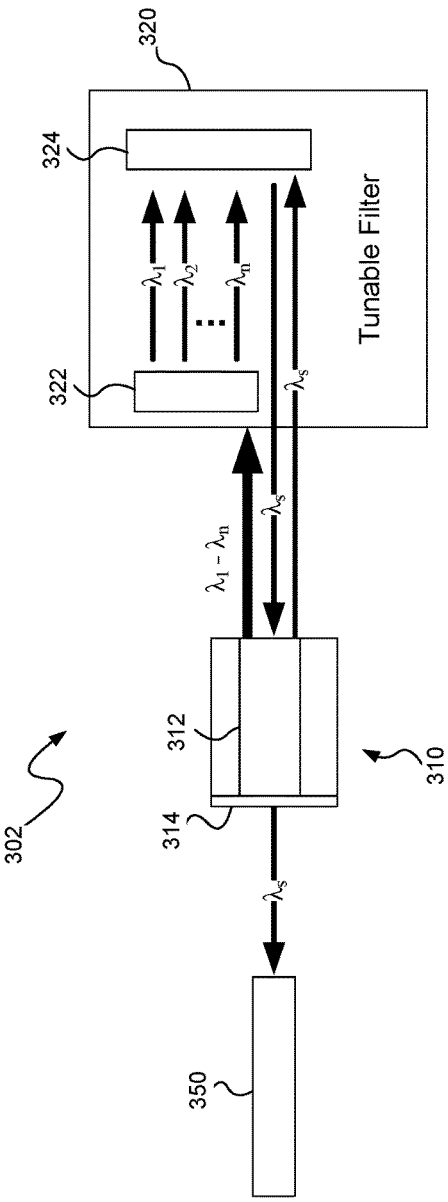
FIG. 3 is a schematic functional block diagram illustrating a wavelength-selectable laser device providing spatially-selectable wavelength(s), consistent with embodiments of the present disclosure.

Referring to FIG. 3, a wavelength-selectable laser device 302, consistent with embodiments of the present disclosure, includes a laser emitter 310 for emitting a spectrum of light across a range of wavelengths (e.g., $\lambda_1$ to $\lambda_n$) and a tunable filter 320 for spatially separating different wavelengths of the light and reflecting at least one spatially-selected wavelength ($\lambda_s$) back to the laser emitter 310. The spatially-selected wavelength ($\lambda_s$) reflected back into the laser emitter 310 is allowed to complete the laser cavity. The laser emitter 310 includes a gain region 312 for amplifying the spatially-selected wavelength ($\lambda_s$) and providing the broad band gain that results in lasing when the gain exceeds the cavity losses. The laser output at the selected wavelength ($\lambda_s$) may be provided from the laser emitter 310 and may be coupled into an optical waveguide or fiber 350, for example, for transmission in an optical communication system such as a WDM system or WDM-PON. The selected wavelength ($\lambda_s$) may be a channel wavelength in a WDM-PON or other WDM system, such as the channel wavelengths defined by the ITU-T DWDM grid. Although the illustrated embodiment shows the laser output at the selected wavelength ($\lambda_s$) from one side of the laser emitter 310, the laser output may also be provided from the other side as will be described in greater detail below.

A front reflector 314 reflects at least a portion of the light from the laser emitter 310 and the light passes into the tunable filter 320. The tunable filter 320 generally includes a dispersive optical element 322 and a back reflector 324. The dispersive optical element 322 disperses the light emitted from the laser emitter 310 and spatially separates different wavelengths (e.g., $\lambda_1$ to $\lambda_n$) of the light. The back reflector 324 reflects the spatially-selected wavelength ($\lambda_s$) back to the laser emitter 310, thus forming a laser cavity between the front reflector 314 and the back reflector 324 and including the gain region 312. The laser cavity is thus only sufficiently reflective to achieve lasing at the spatially-selected wavelength ($\lambda_s$).

The dispersive optical element 322 may include a diffraction grating such as a reflection grating or a transmission grating, a prism, or other dispersive optical elements capable of spatially separating different wavelengths of light. The tunable filter 320 may also include other components or elements to facilitate the spatial selection of the selected wavelength ($\lambda_s$) by preventing reflection and/or blocking transmission of the other wavelengths at the respective spatial locations and allowing reflection and transmission of the selected wavelength ($\lambda_s$). In particular, the wavelengths may be spatially selected by varying the reflectivity of a surface of the mirror, by using a spatial filter between the dispersive optical element and the mirror, or by using a mirror array with selectable reflective elements, as will be described in greater detail below.

The laser emitter 310 may include a multiple quantum-well active region or other gain media capable of emitting a spectrum of light across a range of wavelengths and capable of amplifying light reflected back into the gain media. The laser emitter 310 may include, for example, a laser or gain chip such as a semiconductor or diode laser (e.g., a Fabry-Perot diode laser), a super-luminescent light emitting diode, or other light emitting modules. The front reflector 314 may include a cleaved facet on a laser or gain chip and/or may include reflective or partially reflective coatings or distributed Bragg reflectors (DBRs) on the gain chip or separate from the gain chip. The front reflector 314 may be partially reflective (e.g., about 50% reflectivity) when laser output is coupled from that side of the laser emitter 310 as shown. The front reflector 314 may be highly reflective (e.g., at least about 80% reflectivity) when laser output is coupled from the opposite side of the laser emitter 310.

Figure 4A:
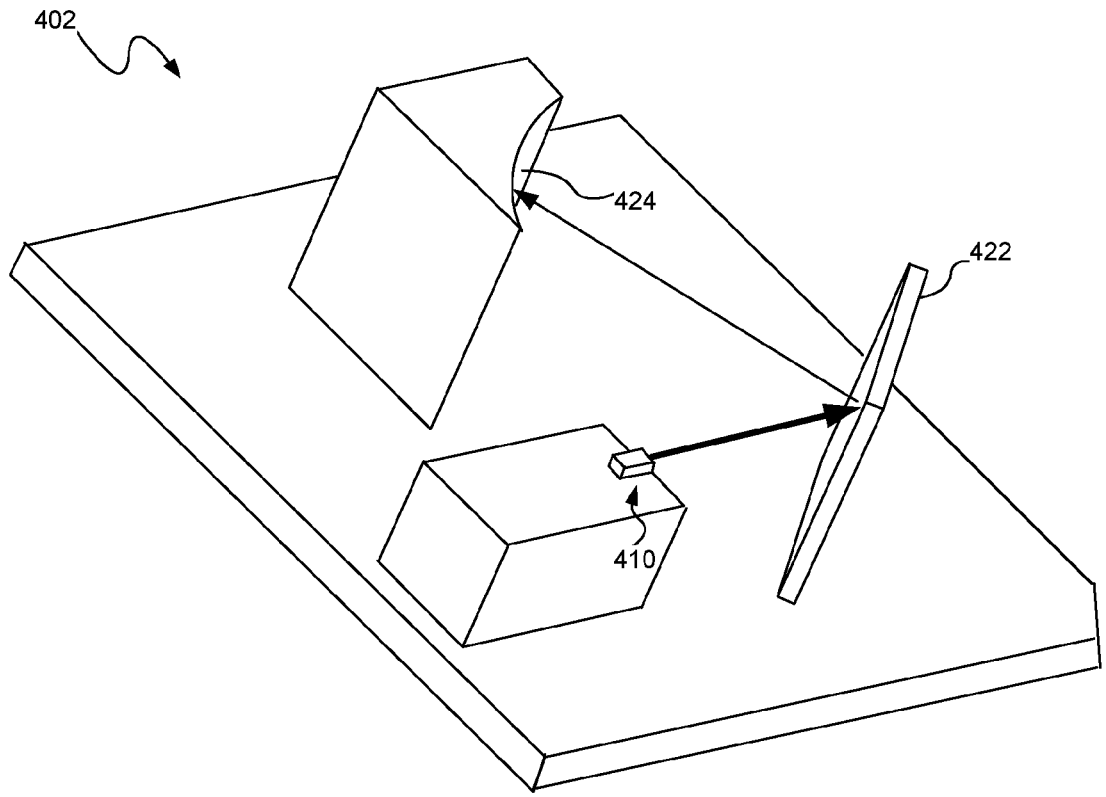
FIG. 4A is a schematic perspective view of a wavelength-selectable laser device providing spatially-selectable wavelength(s) by reflection from a diffraction grating, consistent with some embodiments of the present disclosure.
Figure 4B:
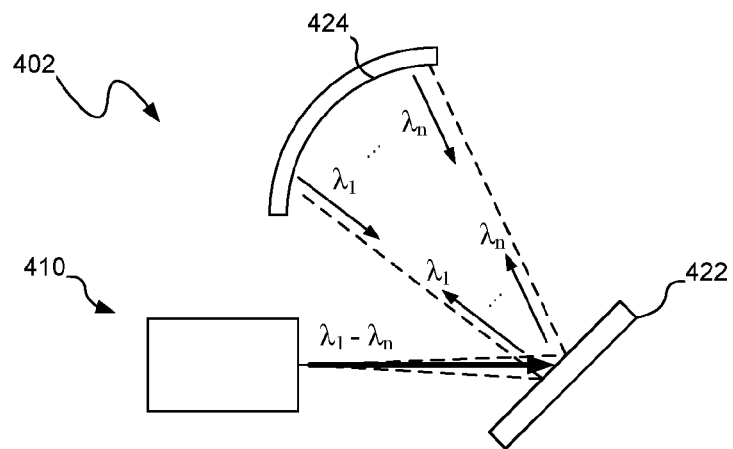
FIG. 4B is a schematic diagram illustrating operation of a wavelength-selectable laser device providing spatially-selectable wavelength(s) by reflection from a diffraction grating, consistent with some embodiments of the present disclosure.

Referring to FIGS. 4A and 4B, a wavelength-selectable laser device 402 providing spatially-selectable wavelength (s), consistent with some embodiments of the present disclosure, includes a laser emitter 410 for emitting a spectrum of light across a range of wavelengths (e.g., $\lambda_1$ to $\lambda_n$), a diffraction grating 422 for dispersing and spatially separating different wavelengths of the light, and a back reflector 424 for reflecting spatially-selected wavelengths back to the diffraction grating 422 and the laser emitter 410. As shown in FIG. 4B, the laser emitter 410 emits light at a range of wavelengths (e.g., $\lambda_1$ to $\lambda_n$) within an envelope of the gain medium and the diffraction grating 422 reflects the different wavelengths at different angles relative to the diffraction grating 422. The different wavelengths at different angles are thus directed to and reflected from different locations on the back reflector 424. By blocking certain reflecting locations or preventing reflection from certain locations on the back reflector 424, wavelengths may be spatially selected for reflection and for completing the laser cavity including the laser emitter 410 and the back reflector 424. The diffraction grating 422 may thus be fixed and is not required to be moved for tuning the laser device. In the illustrated embodiment, the back reflector 424 is a curved mirror that directs the reflected wavelengths back to the diffraction grating 422 and into the laser emitter 410.

Figure 5A:
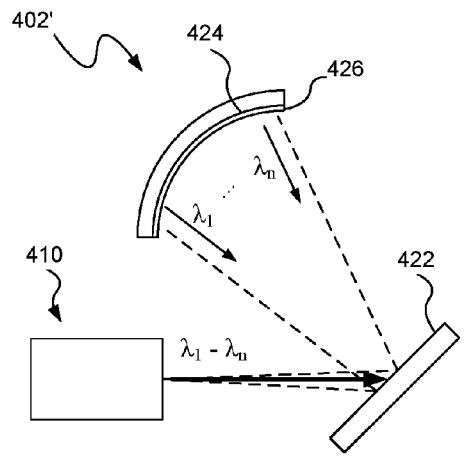
FIGS. 5A and 5B are schematic diagrams illustrating operation of an embodiment of a wavelength-selectable laser device for spatially selecting wavelength(s) by selectively coating a mirror.
Figure 5B:
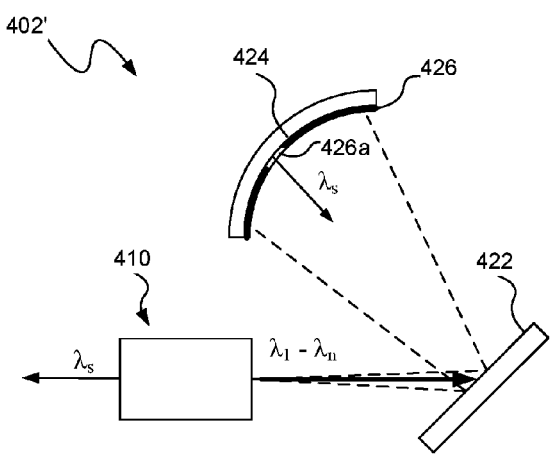

Referring to FIGS. 5A and 5B, one embodiment of the wavelength-selectable laser device 402' includes a coating 426 on the back reflector 424, which is capable of blocking the reflecting locations. By obscuring certain regions on the back reflector 424, the laser cavity is only sufficiently reflective to achieve lasing at the wavelength(s) selected by the non-opaque region(s) of the coating 426, thereby effectively selecting one or more wavelengths from among those that would otherwise have been supported by the cavity. As shown in FIG. 5B, for example, the coating 426 may be altered such that the coating 426 is opaque except for a region 426a reflecting the selected wavelength $\lambda_s$ back to the diffraction grating 422 and into the laser emitter 410, resulting in a laser output at the spatially selected wavelength $\lambda_s$. Although the laser output is shown from one side of the laser emitter 410, the laser output may also be provided from the opposite side of the laser emitter 410.

The back reflector 424 may be coated, for example, with a polymer material that becomes opaque or less reflective around the laser wavelength(s) when heated above a particular temperature. Small heating elements (not shown) may be embedded behind the back reflector 424 to allow an external current to be employed to locally heat the coated back reflector 424 such that certain regions become opaque and other regions are left non-opaque.

Figure 6A:
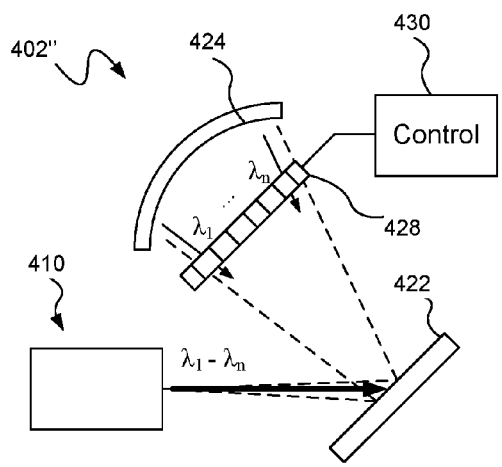
FIGS. 6A and 6B are schematic diagrams illustrating operation another embodiment of a wavelength-selectable laser device for spatially selecting wavelength(s) by selectively controlling a spatial filter.
Figure 6B:
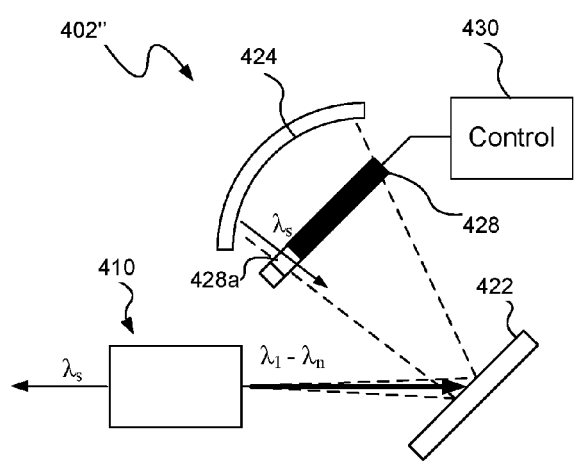

Referring to FIGS. 6A and 6B, another embodiment of the wavelength-selectable laser device 402" includes a pixilated spatial filter 428 capable of blocking the reflecting locations on the back reflector 424 by forming opaque regions. By interposing this spatial filter 428 between the diffraction grating 422 and the back reflector 424, the laser cavity is only sufficiently reflective for lasing at the wavelength(s) selected by the non-opaque region(s) of the spatial filter 428, thereby effectively selecting certain wavelengths for the output of the laser. As shown in FIG. 6B, for example, the spatial filter 428 may be controlled such that the spatial filter 428 is opaque except for a region 428a passing the selected wavelength $\lambda_s$, which is reflected back to the diffraction grating 422 and into the laser emitter 410, resulting in a laser output at the spatially selected wavelength $\lambda_s$.

The pixilated spatial filter 428 may include, for example, a liquid crystal or patterned semiconductor pixel array that may be controlled to select the opaque and non-opaque regions. For example, an Indium Gallium Arsenide Phosphide (InGaAsP) crystal with electrodes can be made to be locally opaque between the electrodes by the application of an electrical field. The electrodes may be modulated, therefore, to make certain regions of the crystal opaque while others are transmissive. Alternative spatial filters may include liquid crystals, birefringent crystals, optical polymers, or the like. Tuning may also be accomplished by heating, applied electric fields, magnetic fields, light absorption, current flow, or the like.

This embodiment of the wavelength-selectable laser device 402" may also include a control 430 that allows the selected wavelength $\lambda_s$ to be changed by controlling the spatial filter 428 to form different non-opaque regions. The control 430 may include control circuitry coupled to the spatial filter, for example, to apply an electrical field to different electrodes such that a desired wavelength is selected.

In other embodiments, the back reflector 424 may include a mirror array configured to reflect light at certain selected reflective regions. Other optical components may also be used to facilitate the spatial selection and transmission of light in the wavelength-selectable laser devices 402, 402', 402".

Figure 7:
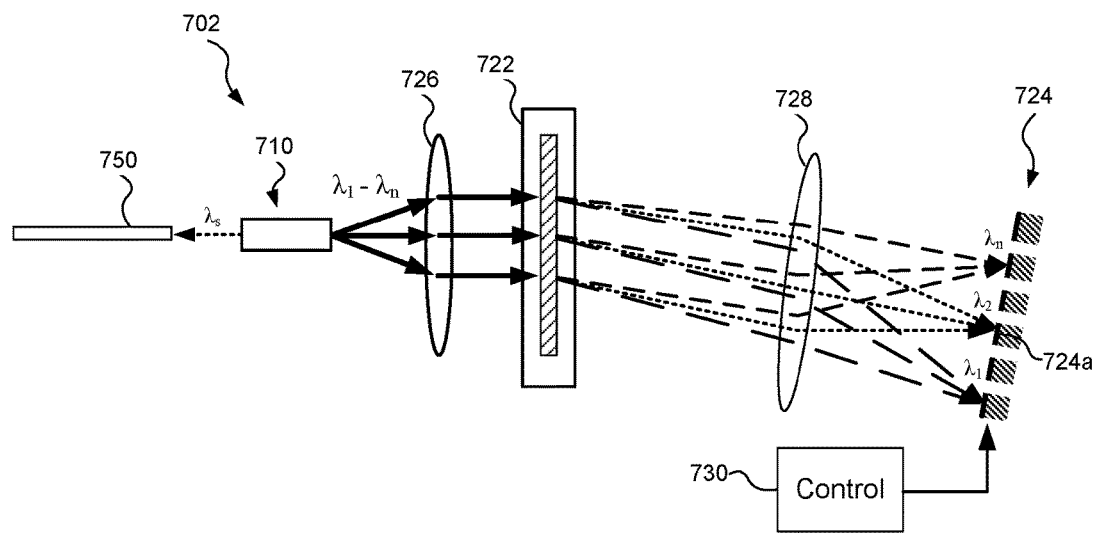
FIG. 7 is a schematic diagram illustrating operation of a further embodiment of a wavelength-selectable laser device providing spatially-selectable wavelength(s) by transmission through a volume phase grating and by selective reflection from a mirror array.

Referring to FIG. 7, a further embodiment of a wavelength-selectable laser device 702 providing spatially-selectable wavelength(s) includes a laser emitter 710, a volume phase grating (VPG) 722, a mirror array 724, and assisting optics 726, 728. The laser emitter 710 emits the spectrum of light across a range of wavelengths (e.g., $\lambda_1$ to $\lambda_n$), and the VPG 722 disperses different wavelengths of the light at different angles as the light passes through the VPG 722. Collimating optics 726 collimate the light emitted from the laser emitter 710 and direct the collimated light to the VPG 722, and focusing optics 728 focus the dispersed light such that the different wavelengths are directed to different locations on the mirror array 724. The mirror array 724 provides reflection at a selected reflective region 724a to selectively reflect at least one spatially-selected wavelength back to the laser emitter 710 to complete the laser cavity formed between the laser emitter 710 and the mirror array 724. The VPG 722 may thus be fixed and is not required to be moved for tuning the laser device. Although the example embodiment includes a VPG, other transmission gratings may also be used.

The mirror array 724 may include a microelectromechanical system (MEMS) mirror array. A control 730, such as control circuitry, may be coupled to the mirror array 724 and used to control the regions of the mirror array 724 that are reflective to select the desired wavelength. Although a mirror array 724 is shown, the wavelength-selectable laser device 702 may also include a mirror with a coating or a spatial filter to block the other wavelengths from being reflected as described above in connection with FIGS. 5A-6B.

In the embodiment shown in FIG. 7, a front reflector (not shown) of the laser emitter 710 is partially reflective to allow the laser output at the selected wavelength ($\lambda_s$) from this side of the laser emitter 710. The laser output at the selected wavelength ($\lambda_s$) may be coupled into an optical waveguide or fiber 750.

Figure 8:
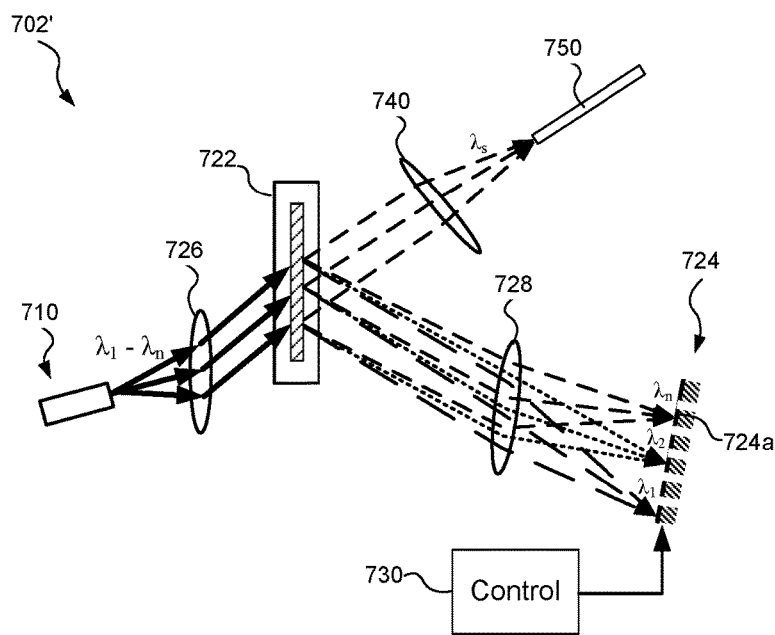
FIG. 8 is a schematic diagram illustrating yet another embodiment of a wavelength-selectable laser device providing spatially-selectable wavelength(s) by transmission through a volume phase grating and by selective reflection from a mirror array.

According to another embodiment of the wavelength-selectable laser device 702', shown in FIG. 8, a front reflector (not shown) of the laser emitter 710 may be highly reflective such that the laser output at the selected wavelength ($\lambda_s$) is provided from the opposite side of the laser emitter 710 and passed through the VPG 722 as a zero order direct transmission (i.e., the $0^{th}$ diffraction order of the grating). The zero order direct transmission of the selected wavelength ($\lambda_s$) passing through the VPG 720 is focused by a lens 740 to an optical waveguide or fiber 750. In this embodiment, the laser emitter 710 is angled and offset relative to the VPG 722 to direct the emitted light at an angle relative to the VPG 722 such that the separated wavelengths are directed to and focused on the mirror array 724 and the zero order direct transmission is directed to and focused on the waveguide or fiber 750.

Accordingly, wavelength-selectable laser devices providing spatially selectable wavelengths, consistent with embodiments described herein, are relatively inexpensive and relatively stable over time (e.g., compared to continuously-tunable laser sources) because moving parts are not required for continuous tuning of the laser. In particular, wavelength-selectable laser devices providing spatially selectable wavelengths generally do not require delicate alignment because the wavelength grid may be defined based on a spatial location of the light rather than by altering a grating angle or a distance between two partial reflectors.

Consistent with one embodiment, a wavelength-selectable laser device provides at least one spatially-selectable wavelength. The wavelength-selectable laser device includes a laser emitter with a gain region for emitting light at a plurality of wavelengths and a dispersive optical element for reflecting or passing the wavelengths such that different wavelengths are directed from the dispersive optical element at different angles. A front reflector reflects light from the laser emitter. The wavelength-selectable laser device also includes a back reflector for reflecting at least one selected wavelength of the wavelengths of light back to the laser emitter based on a spatial location of the selected wavelength(s) relative to the back reflector. A laser cavity is formed between the back reflector and the front reflector and including the gain region.

Consistent with another embodiment, a wavelength division multiplexed (WDM) system includes a plurality of terminals associated with different respective channel wavelengths and configured to transmit optical signals on the different respective channel wavelengths. At least one of the plurality of terminals includes at least a tunable optical transmitter configured to be tuned to a respective channel wavelength. The tunable optical transmitter includes a wavelength-selectable laser device configured to provide spatially-selectable channel wavelengths by reflecting at least one selected channel wavelength based on a spatial location of the channel wavelength and causing the spatially-selected channel wavelength to complete a laser cavity in the laser device.

Consistent with one embodiment, a wavelength-selectable laser device includes a laser emitter with a gain region for emitting light at a plurality of wavelengths, a front reflector for reflecting light from the laser emitter, a diffraction grating for reflecting or passing the wavelengths such that different wavelengths are directed from the diffraction grating at different angles, a back reflector for reflecting at least one of the wavelengths of the light back to the laser emitter, and a coating on the back reflector. The coating is configured to form at least one opaque region and at least one non-opaque region such that the back reflector selectively reflects at least one selected wavelength selected by the at least one non-opaque region. A laser cavity is formed between the back reflector and the front reflector and is sufficiently reflective to achieve lasing at the selected wavelength(s).

Consistent with another embodiment, a wavelength-selectable laser device includes a laser emitter with a gain region for emitting light at a plurality of wavelengths, a front reflector for reflecting light from the laser emitter, a diffraction grating for reflecting or passing the wavelengths such that different wavelengths are directed from the diffraction grating at different angles, a back reflector for reflecting at least one of the wavelengths of the light back to the laser emitter, and a spatial filter located between the diffraction grating and the back reflector. The spatial filter includes at least one opaque region and at least one non-opaque transmissive region such that the back reflector selectively reflects at least one selected wavelength selected by the at least one non-opaque transmissive region. A laser cavity is formed between the back reflector and the front reflector, and wherein the laser cavity is sufficiently reflective to achieve lasing at the selected wavelength(s) selected by the non-opaque transmissive region(s).

Consistent with a further embodiment, a wavelength-selectable laser device includes a laser emitter with a gain region for emitting light at a plurality of wavelengths, a front reflector for reflecting light from the laser emitter, and a volume phase grating (VPG) for passing the wavelengths such that different wavelengths are directed from the VPG at different angles. The laser device also includes collimating optics for collimating light emitted from the laser emitter and directing the light to the VPG, a mirror array configured to selectively reflect light from a selected reflective region of the mirror array, and focusing optics for focusing the light passing through the VPG at the different wavelengths onto the mirror array such that the different wavelengths are incident on the mirror array at different respective locations on the mirror array. A laser cavity is formed between the front reflector and the selected reflected region of the mirror array.

While the principles of the invention have been described herein, it is to be understood by those skilled in the art that this description is made only by way of example and not as a limitation as to the scope of the invention. Other embodiments are contemplated within the scope of the present invention in addition to the exemplary embodiments shown and described herein. Modifications and substitutions by one of ordinary skill in the art are considered to be within the scope of the present invention, which is not to be limited except by the following claims.

What is claimed is:

1. A wavelength-selectable laser device comprising:
   a laser emitter for emitting light at a plurality of wavelengths, the laser emitter including a gain region;
   a front reflector configured to reflect light from one side of the laser emitter;
   a volume phase grating (VPG) for passing the wavelengths such that different wavelengths are directed from the VPG at different angles;
   collimating optics for collimating light emitted from the laser emitter and directing the light to the VPG;
   a mirror array configured to selectively reflect light from a selected reflective region of the mirror array;
   focusing optics for focusing the light passing through the VPG at the different wavelengths onto the mirror array such that the different wavelengths are incident on the mirror array at different respective locations on the mirror array;
   wherein a laser cavity is formed between the selected reflected region of the mirror array and the front reflector and including the gain region; and
   wherein the front reflector is highly reflective and the laser emitter is configured to provide laser output at the selected wavelength(s) from an opposite side of the laser emitter, and wherein the laser output is passed through the VPG as a zero order direct transmission, and further comprising focusing optics for focusing the zero order direct transmission to couple the laser output at the selected wavelength(s).

2. The wavelength-selectable laser device of claim 1 wherein the tunable filter further comprises control circuitry coupled to the mirror array and configured to control regions of the mirror array that are reflective to control selection of the spatially-selected wavelength reflected back to the laser emitter.

3. The wavelength-selectable laser device of claim 1 wherein the mirror array includes a microelectro-mechanical (MEMS) mirror array.

4. The wavelength-selectable laser device of claim 1 wherein the VPG is fixed such that wavelength selection is provided without moving the VPG.

5. A wavelength division multiplexed (WDM) system comprising:
- a plurality of terminals associated with different respective channel wavelengths and configured to transmit optical signals on the different respective channel wavelengths, at least one of the plurality of terminals including at least a tunable optical transmitter configured to be tuned to a respective channel wavelength, the tunable optical transmitter comprising a wavelength-selectable laser device configured to provide spatially-selectable channel wavelengths by reflecting at least one selected channel wavelength based on a spatial location of the channel wavelength and causing the spatially-selected channel wavelength to complete a laser cavity in the laser device, wherein the wavelength-selectable laser device comprises:
- a laser emitter for emitting light at a plurality of wavelengths, the laser emitter including a gain region;
- a front reflector configured to reflect light from one side of the laser emitter;
- a volume phase grating (VPG) for passing the wavelengths such that different wavelengths are directed from the VPG at different angles;
- collimating optics for collimating light emitted from the laser emitter and directing the light to the VPG;
- a mirror array configured to selectively reflect light from a selected reflective region of the mirror array;
- focusing optics for focusing the light passing through the VPG at the different wavelengths onto the mirror array such that the different wavelengths are incident on the mirror array at different respective locations on the mirror array;
- wherein a laser cavity is formed between the selected reflected region of the mirror array and the front reflector and including the gain region; and
- wherein the front reflector is highly reflective and the laser emitter is configured to provide laser output at the selected wavelength(s) from an opposite side of the laser emitter, and wherein the laser output is passed through the VPG as a zero order direct transmission, and further comprising focusing optics for focusing the zero order direct transmission to couple the laser output at the selected wavelength(s).

6. The WDM system of claim 5 comprising:
- at least one central office configured to transmit and receive aggregate WDM optical signals including the channel wavelengths; and
- at least one branching point located between the central office and the plurality of terminals, the branching point being configured to combine the optical signals at the channel wavelengths.

* * * * *